(12) United States Patent
McElheny et al.

(10) Patent No.: US 7,235,884 B1
(45) Date of Patent: Jun. 26, 2007

(54) LOCAL CONTROL OF ELECTRICAL AND MECHANICAL PROPERTIES OF COPPER INTERCONNECTS TO ACHIEVE STABLE AND RELIABLE VIA

(75) Inventors: Peter John McElheny, Morgan Hill, CA (US); Yow-Juang(Bill) W. Liu, San Jose, CA (US); Jayakannan Jayapalan, San Jose, CA (US); Francois Gregoire, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/405,856

(22) Filed: Apr. 1, 2003

(51) Int. Cl.
*H01L 23/48* (2006.01)
(52) U.S. Cl. ............................ 257/762; 257/774
(58) Field of Classification Search ............. 257/734, 257/741, 752, 753, 774, 784, 762
See application file for complete search history.

(56) References Cited

U.S. PATENT DOCUMENTS

| | | | | |
|---|---|---|---|---|
| 6,117,770 | A * | 9/2000 | Pramanick et al. | 438/659 |
| 6,399,486 | B1 * | 6/2002 | Chen et al. | 438/660 |
| 6,426,289 | B1 * | 7/2002 | Farrar | 438/670 |
| 6,429,105 | B1 * | 8/2002 | Kunikiyo | 438/586 |
| 6,624,075 | B1 * | 9/2003 | Lopatin et al. | 438/687 |
| 6,633,085 | B1 * | 10/2003 | Besser et al. | 257/774 |
| 6,780,342 | B1 * | 8/2004 | Hagihara et al. | 216/67 |
| 2001/0053592 | A1 * | 12/2001 | Sone | 438/584 |
| 2003/0104692 | A1 * | 6/2003 | Hau-Riege et al. | 438/658 |
| 2003/0160327 | A1 * | 8/2003 | Usui et al. | 257/758 |
| 2004/0002211 | A1 * | 1/2004 | Young | 438/678 |
| 2004/0043605 | A1 * | 3/2004 | Chopra | 438/659 |

FOREIGN PATENT DOCUMENTS

JP    10-294315    * 11/1998

OTHER PUBLICATIONS

Streiter et al., "Application of combined thermal and electrical simulation for optimization of deep submicron interconnection systems", Microelectronic Engineering, 60, 2002, pp. 39-49.
Michael J. Aziz, "Thermodynamics of diffusion under pressure and stress: Relation to point defect mechanisms", American Institute of Physics, Appl. Phys. Lett., vol. 70, No. 21, May 26, 1997, pp. 2810-2812.

(Continued)

*Primary Examiner*—Thanh Nguyen
(74) *Attorney, Agent, or Firm*—Morgan, Lewis & Bockius LLP

(57) ABSTRACT

The present invention is a novel method whereby voids or solid opens at the bottom of via can be avoided without drastically altering the resistivity or parasitic capacitances of the whole metal interconnect system. The invention includes in one embodiment a process of forming interconnects and vias in a microelectronic circuit structure. This process includes implanting and/or alloying an impurity element in the local area of the top surface of a metal interconnect at the bottom of a via. Doping may be done before or after formation of the via. After the via is formed, it is filled with a metal such as copper. Another embodiment of the invention is a microelectronic circuit structure manufactured by the aforementioned method.

8 Claims, 4 Drawing Sheets

OTHER PUBLICATIONS

Oshima et al., "Improvement of Thermal Stability of Via Resistance in Dual Damascene Copper Interconnection", (Dec. 10-13, 2000), IEEE International Electron Devices Meeting, San Francisco, CA, pp. 123-126.

Ogawa et al., "Stress-Induced Voiding Under Vias Connected to Wide Cu Metal Leads", 40th Annual International Reliability Physics Symposium, 2002, pp. 312-321.

Barth et al., "Integration of Copper and Fluorosilicate Glass for 0.18μm Interconnections", Proceedings of IITC, 2000, pp. 219-221.

Murarka and Hymes, "Copper Metallization for ULSI and Beyond", Critical Reviews in Solid State and Materials Sciences, 20(2), 1995, pp. 87-124.

Weinkamer et al., "Dynamics of Mesoscopic Precipitate Lattices in Phase Separating Alloys under External Load", http://arxiv.org/pdf/cond-mat/0010439., last visited Mar. 25, 2003.

Thijsse et al., "Controlling Growth of Copper Films on Tantalum", http://dutsm183.stm.tudelf.nl/research/CuTaWeb.pdf., last visited Mar. 25, 2003.

The MOSIS Service, "Reliability in CMOS IC Design: Physical Failure Mechanisms and their Modeling", http://www.mosis.org/Faqs/tech_cmos_rel.pdf., last visited Mar. 25, 2003.

Ovid'ko et al., "Effects of Transformations of Grain Boundary Defects on Diffusion in Nanocrystalline Materials", http://www.ipme.ru/e-journals/MPM/no_2100/ovidko/ovidko.doc., last visited Mar. 25, 2003.

Thijsse and Sietsma, "Paper in Research Areas, Objectives and Report 1999", http://dutsm183.stm.tudelf.nl/research/annrep99b.pdf., last visited Mar. 27, 2003.

* cited by examiner

LOCAL CONTROL OF ELECTRICAL AND MECHANICAL PROPERTIES OF COPPER INTERCONNECTS TO ACHIEVE STABLE AND RELIABLE VIA

The present invention relates generally to the manufacture of microelectronic circuits, and particularly to the formation of metal interconnects and vias.

BACKGROUND OF THE INVENTION

The performance, density, and cost of integrated circuit (IC) chips have been improving consistently and continuously. Much of the improvement has been due to the ability to scale transistors to increasingly smaller dimensions, resulting in higher speed and higher functional density. The continued shrinking of transistor sizes on the IC chips, however, poses many challenges to metal interconnect technology. For instance, as interconnects get thinner and distances between interconnects shrink, resistance and inter-metal capacitance rise. By changing to different materials, i.e. higher conductivity material for the metal lines and lower permittivity (low-k) dielectrics for the insulating material, device geometry can continue to shrink without adversely impacting the maximum operating speed. The switch from aluminum to copper interconnects is part of this change. Copper has the advantage over aluminum of lower resistivity and higher electromigration resistance. As a result, the switch to copper has had a major impact on the speed and operable size of microelectronic circuits.

The switch from aluminum to copper involves a variety of changes in the manufacturing process flow. Since it is difficult to etch copper, newer approaches such as "damascene" and "dual damascene" processing have been employed. Copper damascene/dual-damascene is a process in which vias and/or trenches are etched into the insulating material. Copper is then filled into the vias and/or trenches—most often by an electrochemical plating (ECP) process—and sanded back to form a planar surface with the top surface of the insulating material. This sanding back process is usually accomplished by a process such as chemical mechanical polishing (CMP). By this process, the conducting materials are only left in the vias and trenches. In the dual damascene approach, both vias and trenches are patterned into a layer of dielectric material or a stack of different dielectric materials before the copper is filled in. An advantage of this approach is that only one copper fill and CMP is necessary to form a layer of copper lines and vias that connect one layer of such lines to another layer. The dual damascene approach, however, may require a rather complex dielectric stack that includes a sequence of hard mask, low-k dielectrics, and etch stop layers. Damascene and dual damascene, multi-layer interconnect structures are known in the art. See, for example, *Improvement of Thermal Stability of Via Resistance in Dual Damascene Copper Interconnection*, T. Oshima, et al., IEEE (2000); and *Copper Metallization for ULSI and Beyond*, Shyam P. Murarka et al., in Critical Reviews in Solid State and Materials Sciences, 20(2):87–124 (1995), both of which are hereby incorporated by reference in their entirety and particularly for their discussions of the damascene and dual-damascene processes.

A significant problem for copper interconnects and vias is stress-induced void formation, especially at the bottom of vias. See, for example, *Stress-Induced Voiding Under Vias Connected to Wide Cu Metal Leads*, E. T. Ogawa et al., IEEE (2002), which is hereby incorporated by reference in its entirety and especially for its discussion of stress induced voiding. Stress-induced void formation at the bottom of a via may create a solid open or discontinuity in the connection between the via and the copper interconnect that can cause electrical circuits to fail. These may be termed "killer voids" as they can effectively kill a circuit's ability to operate effectively.

Copper interconnects develop severe voiding at the bottom of vias for several reasons, including the migration of vacancies or micro-voids that are attracted to the bottom of the via by stress fields. Stress fields are a product of thermodynamic and mechanical processes associated with annealing and other multi-layer circuit processing activities. Further, grain formation within the copper interconnect and/or via may further exacerbate the formation of micro-voids and discontinuities. These stress fields and grains become especially prevalent and troublesome when the copper interconnect is constrained on one or more sides by other circuit layers, such as cap layers or barrier layers. Essentially, micro-voids in the copper interconnect structure tend to migrate to and along the top surface of the interconnect, where they may escape harmlessly if that surface of the interconnect is not constrained by a layer above it. As described above, however, the damascene process places one or more layers on top of the copper interconnect, and thus the micro-voids cannot escape. The use of annealing and other processes may produce larger grain formation and additional stress fields in the copper interconnect in this constrained state. The larger grains in turn may produce further micro-voids, as the aggregation of copper into larger grains leaves more open space at the grain boundaries. The micro-voids then aggregate at the bottom of the via as they follow the stress fields. This aggregation is the basis for a killer void or discontinuity at the junction of the copper interconnect and via. The top of the via tends not to suffer such killer voids, because the stress fields there are such that the vacancies are attracted to the top of the metal interconnect (away from the via top opening). Moreover, voids at the top of vias do not generally cause a circuit failure, as there is usually enough copper in place for the current to flow out of the via.

As an example, FIG. 1 is a graphical representation of the formation of killer voids at the bottom of vias. FIG. 1 shows an inter-metal dielectric layer 106 with a via 110 through it down to an underlying metal interconnect 102. Cap or barrier layers 104, 108 are also shown. Micro-voids 112 migrate along the interface between the metal interconnect 102 and the barrier layer 104. These micro-voids 112 aggregate under the via 110 at the top surface of the metal interconnect 102, at least in part due to stress fields 114 within the metal interconnect 102. Grain boundaries 116 and the formation of larger grains during annealing and electrochemical deposition (ECD) processing may produce additional micro-voids and increase the aggregation of micro-voids below the via. The aggregation of micro-voids 112 leads to a killer void 118, wherein the connection between the via 110 and the metal interconnect 102 is completely severed.

Attempts at fixing such stress-induced void formation have involved global changes to the manufacturing process and the structure of the circuit. Specifically, these changes have included: fine-tuning annealing conditions; changing diffusion barriers from Ti/TiN to Ta/TaN; refining electrochemical plating conditions of the copper; and altering the stress applied around the via from inter-metal dielectrics by using a sandwich-type inter-metal dielectric. Success from using these methods has been difficult to achieve and limited in nature, and may become even more elusive as process technologies scale to smaller dimensions. Furthermore, such global changes can adversely affect the speed of the copper interconnect system by increasing either the resistance of the copper lines or their parasitic capacitances. Finally, redundant vias have been implemented to reduce the risk of an open via, but this has a substantial die size penalty and adds to the manufacturing process complexity.

SUMMARY OF THE INVENTION

The present invention addresses the aforementioned problems by altering the mechanical and electrical properties of a metal interconnect in the local area beneath a via. The present invention is a novel method whereby the development of voids and discontinuities at the bottom of via can be avoided without drastically altering the resistivity or parasitic capacitances of the whole metal interconnect system. Only the electrical and physical characteristics in the local area of the interconnect at the bottom of the via are altered. Such local alteration can produce various beneficial effects, such as: reducing the stress fields in the metal interconnect; creating a high stress field sink for vacancies away from the bottom of the via; reducing vacancy formation by limiting re-crystallization or grain growth in the interconnect; and/or impeding the diffusion of vacancies in the bulk interconnect or at the metal-capping layer interface. This is especially useful in the increasingly prevalent use of copper interconnects and vias.

The invention in one embodiment is a process of forming interconnects and vias in a microelectronic circuit structure. This process includes creating a metal interconnect in a first inter-metal dielectric layer, depositing one or more inter-metal dielectric layers on top of the first inter-metal dielectric layer, etching a via through the one or more inter-metal dielectric layers down to the first metal interconnect, the via having a bottom area proximate to a portion of the metal interconnect, and adding an impurity element in the metal interconnect in a bottom area of the via. The via is then filled with a metal. This process can be implemented in a standard process flow without any additional masking steps or significant changes to current processes.

Another embodiment of the invention is a microelectronic circuit structure with stable and reliable vias and interconnects. This microelectronic circuit structure includes a metal interconnect layer in a first inter-metal dielectric layer of a circuit structure, a second inter-metal dielectric layer on top of the first inter-metal dielectric layer, a metal via passing through the second inter-metal dielectric layer, the via having a bottom area contacting the first metal interconnect layer, and a portion of the metal interconnect under the via bottom doped with an impurity element to limit the growth of voids between the first metal interconnect layer and the via.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

The present invention includes a via formation process wherein impurity elements are introduced locally in the metal interconnect below a via. This local alteration or doping limits the development of "killer voids" at the bottom of via without drastically altering the resistivity or parasitic capacitances of the metal interconnect system as a whole. The beneficial effects of this local doping include: reducing the stress fields in the metal interconnect; creating a high stress field sink for vacancies away from the bottom of a via; reducing vacancy formation by limiting re-crystallization or grain growth in the interconnect; and/or impeding the diffusion of vacancies in the bulk interconnect or at the metal-capping layer interface. All of these effects may contribute some part to the reduced occurrence of killer voids at the bottom of a via so formed.

Figure 2:
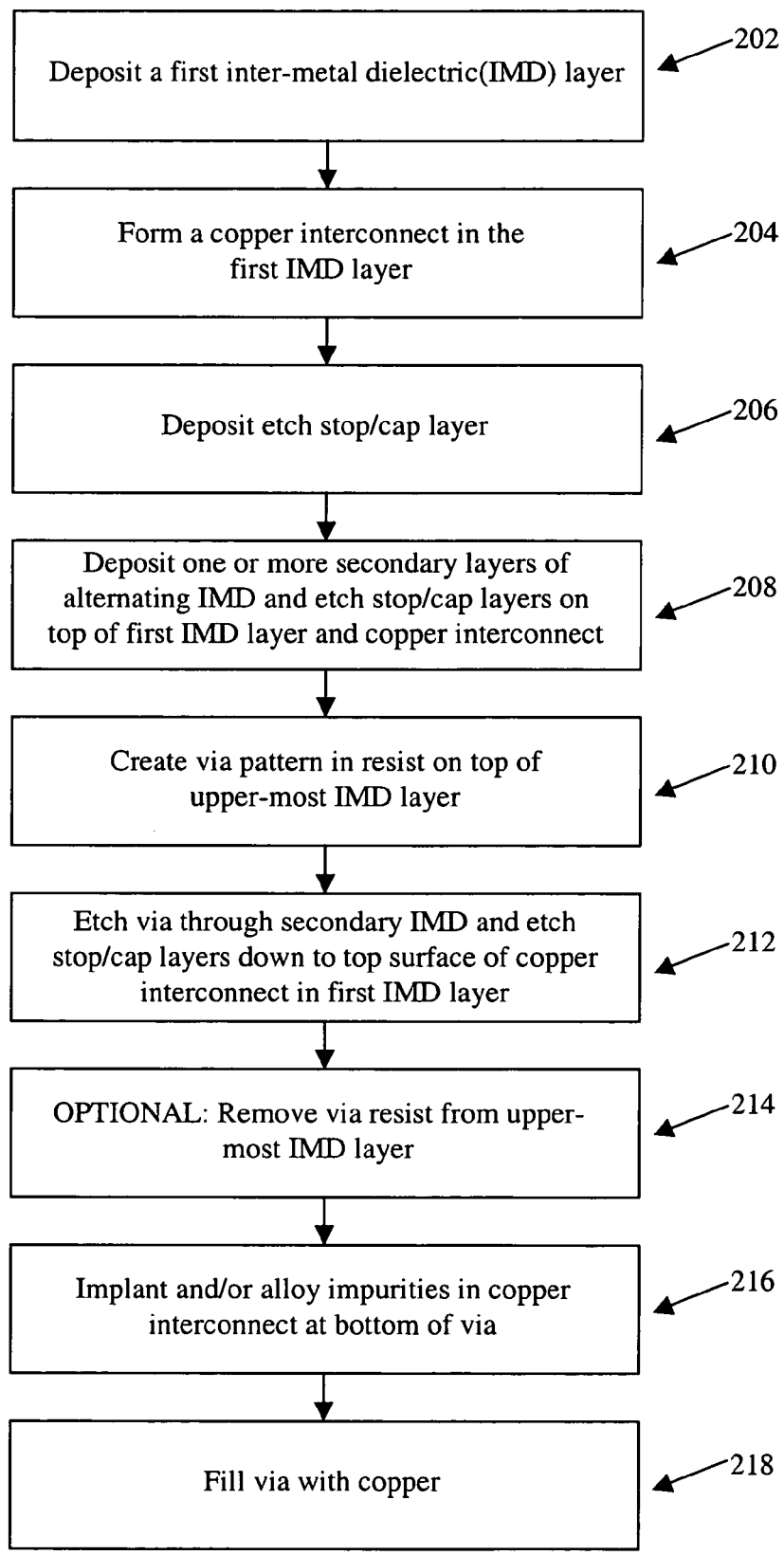
FIG. 2 is a flowchart of a process for creating metal vias according to an embodiment of the present invention.

An embodiment of the present invention for via formation is shown in the flowchart of FIG. 2. A first inter-metal dielectric (IMD) layer is deposited at step 202 on a wafer substrate or on top of another microelectronic circuit layer. These IMD layers may include such materials as fluorinated silicate glass (FSG), low-k dielectrics, or any type of sandwiched dielectrics. A copper interconnect is formed at step 204 in the first IMD layer using one of various known techniques. Most often the formation of the interconnect includes patterning the interconnect in a photoresist using a photolithography process, followed by etching the interconnect into the IMD layer. Such etching may include dry etch (plasma etch) or wet etch processes. The resulting interconnect trough is then filled with a metal, which in the case of copper will likely be by electrochemical plating (ECP). Copper often requires chemical mechanical polishing (CMP) to planarize the top of the first IMD layer and the interconnect so that further layers may be deposited upon them in building the microelectronic structure vertically. A cap layer or etch stop layer may then be deposited at step 206 on top of the first IMD layer including the copper interconnect formed therein. Cap layers and etch stop layers may include such materials as SiN, SiC or SiCN, for example. This cap/etch stop layer serves as a stop or limit for later etching processes carried on in layers above that of the first IMD layer. In other words, these cap/etch stop layers serve to protect lower levels and maintain the distinct physical characters of the various layers.

One or more secondary layers of inter-metal dielectrics (IMD) may then be deposited at step 208 on top of the cap layer, often with further etch stop/cap layers separating these secondary IMD layers as necessary to support the constraints of the microelectronic circuit structure and the processing techniques used in building that structure. Etch stop layers are most often found in layers at or near the top of vias, whereas cap layers are usually found at or near the top of a copper interconnect. These terms may be used somewhat interchangeably, as these layers are usually made up of the same materials and formed using a deposition process. When the desired thicknesses of IMD layers and cap/etch stop layers have been created above the copper interconnect, a via is then patterned at step 210 on top of the upper most IMD layer. This via patterning includes laying down a photoresist on the top surface of the upper most IMD layer. Using a lithography process, a pattern for the top opening of the via can then be patterned in the resist. Using either a dry (plasma) or wet etch process, the via may then be etched vertically at step 212 starting at the patterned top opening and continuing down through the secondary IMD layers and etch stop/cap layers. This etching process is controlled so as to stop the etch at or near the top surface of the copper interconnect. The bottom of the via is then at the top surface of the metal interconnect, or, if an over-etch is employed, the bottom of the via may be below the top surface and within the copper interconnect.

Figure 1:
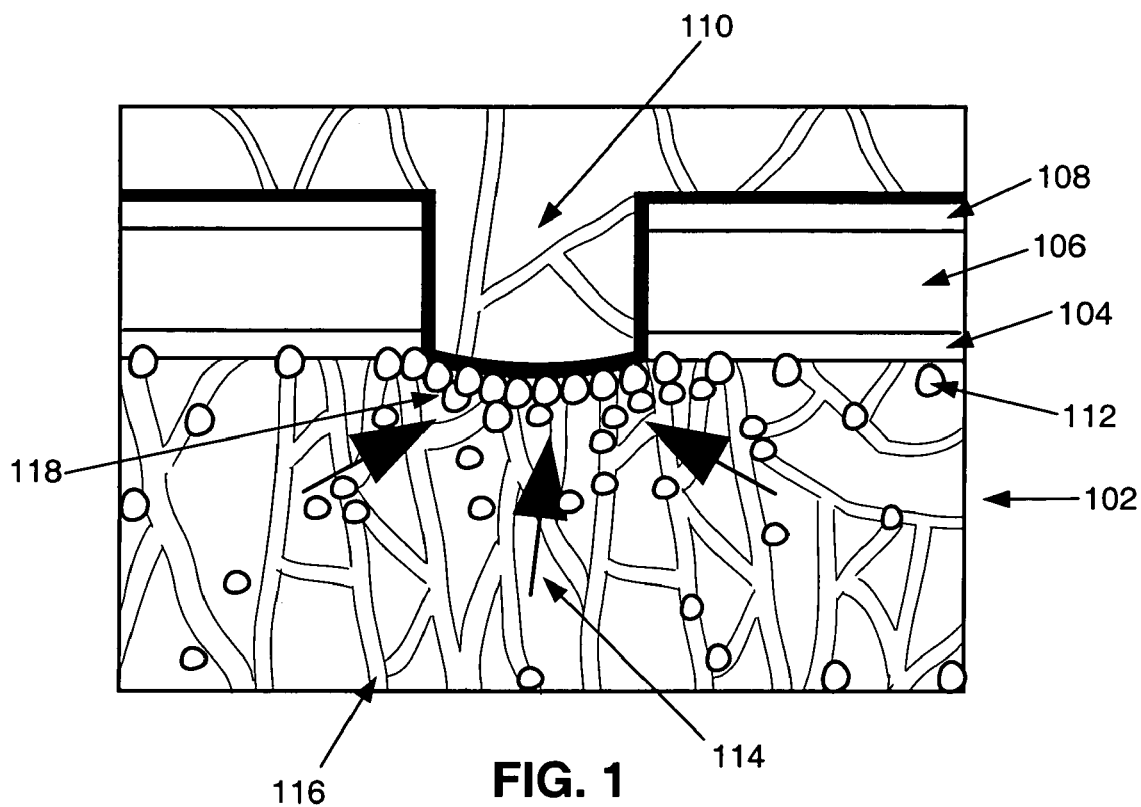
FIG. 1 is a cross-sectional view of a via and the formation of a void at the bottom of the via at the metal interconnect junction.
Figure 4:
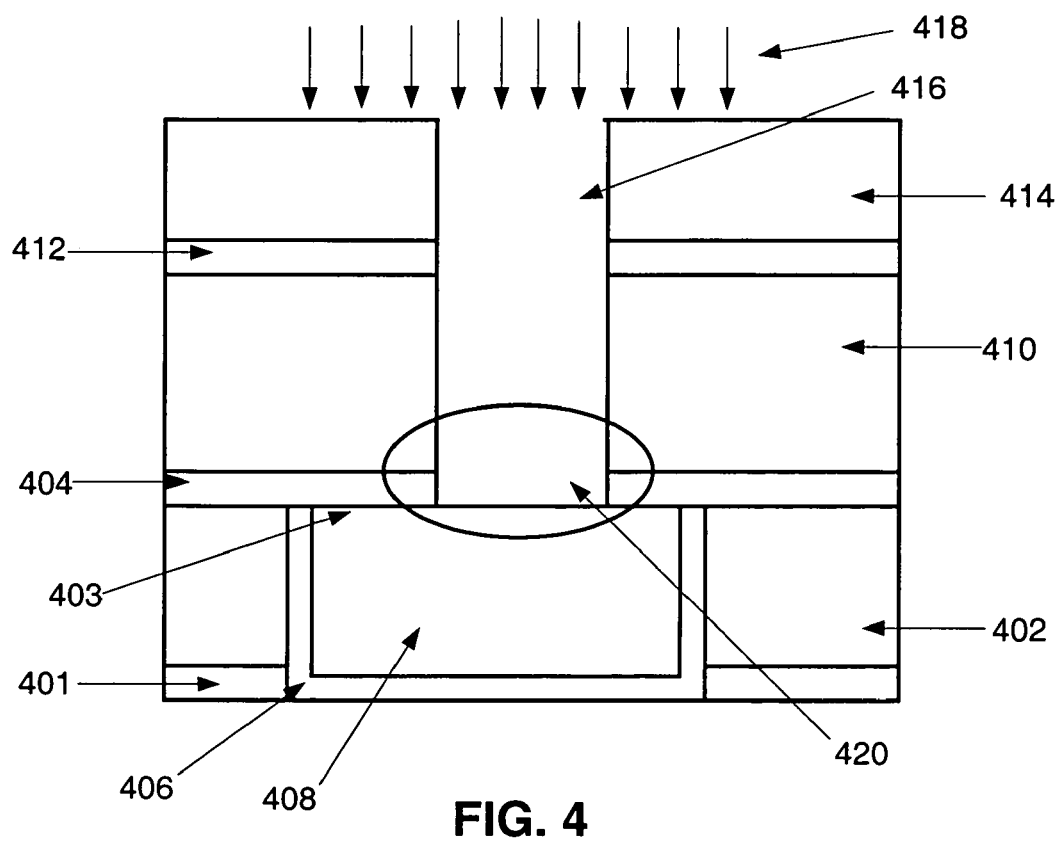
FIG. 4 is a cross-sectional view of an empty via through two inter-metal dielectric layers above a metal interconnect showing impurity elements being implanted into and/or deposited on a metal interconnect.

FIG. 4 is an exemplary representation of the multi-layer structure and via at this point in the process. A copper interconnect layer 408 is shown in a first IMD layer 402. A barrier layer 406 has been deposited between the copper interconnect 408 and the surrounding first IMD layer 402— i.e. the barrier layer is deposited before the copper is deposited in the interconnect trough. This barrier layer often includes such materials as titanium/titanium-nitride (Ti/TiN) or tantalum/tantalum-nitride (Ta/TaN). A via 416 passes through two upper IMD layers 410, 414, an etch stop layer 412 and a cap layer 404. The bottom of the via 416 is at a top surface of the copper interconnect 408.

Continuing with FIG. 2, the remaining photoresist from the via pattern on the top surface of the uppermost IMD layer may optionally be removed at step 214. Removal of such remaining photoresist may involve various cleaning methods. Alternatively, the photoresist may be kept on the top IMD surface through one or more of the following steps according to the needs of the design and manufacturing process. For example, the photoresist might be kept on through the implant or alloy steps 216 to protect the top surface of the uppermost IMD layer from receiving unwanted ions or alloy elements.

With the via formed down to the copper interconnect, the bottom of the via is now exposed for the introduction of one or more impurity elements at step 216. These impurity elements or dopants operate to alter the local mechanical and electrical properties of the top surface of the copper interconnect under the via bottom. These impurity elements may be introduced by ion implantation, alloying or a combination of the two, or by other processes used for such purpose.

The ion implant process introduces ions of one or more impurity elements into the bottom of the via. Specifically, the impurity element ions are introduced into the top surface of the copper interconnect at the bottom of the via. This involves accelerating the ions to a pre-determined energy and causing them to impact the target surface—i.e. the bottom of the via. Most often, the ions will impact a wide area of the top surfaces of the entire structure, which will include the via bottom. Again, leaving the photoresist on the top surface of the upper-most IMD layer will provide some protection from ions directly impacting areas other than the bottom of the via. The pre-determined energy is chosen so as to cause the ions to enter the surface of the copper at the bottom of the via to a desired depth therein and preferably without causing unnecessary damage to the crystal lattice structure of the interconnect copper.

A similar result may be achieved by alloying an impurity element with the copper interconnect. Alloying involves two primary steps: depositing a layer of dopant or impurity element on the copper interconnect and annealing that impurity element layer with the underlying copper interconnect. First, a layer of one or more impurity elements is deposited at the bottom of the via—i.e. on the top surface of the copper interconnect exposed at the bottom of the via. Next, the deposited impurity element is annealed to the interconnect by heating to a pre-determined temperature causing the impurity element(s) to alloy with the copper at the bottom of the via. As such, the resulting alloy produces the beneficial effects disclosed above. The annealing temperature should be chosen to allow the impurity to alloy with the copper interconnect without causing unnecessary damage to the structure as a whole and within the constraints of the manufacturing process. Deposition of the impurity element(s) may be carried out by chemical vapor deposition (CVD) or plasma vapor deposition (PVD or sputtering). Sputtering may be especially appropriate for depositing impurity element(s) in a low-k IMD environment, as sputtering is less likely to damage low-k IMD layers.

Once the implanting and/or alloying of one or more impurity elements is complete, the via is filled with copper at step 218. To complete the damascene or dual-damascene process, filling the via often involves electrochemical plating (ECP), followed by a chemical-mechanical polishing (CMP) process to planarize the top IMD layer and the top of the now-filled via.

Figure 3:
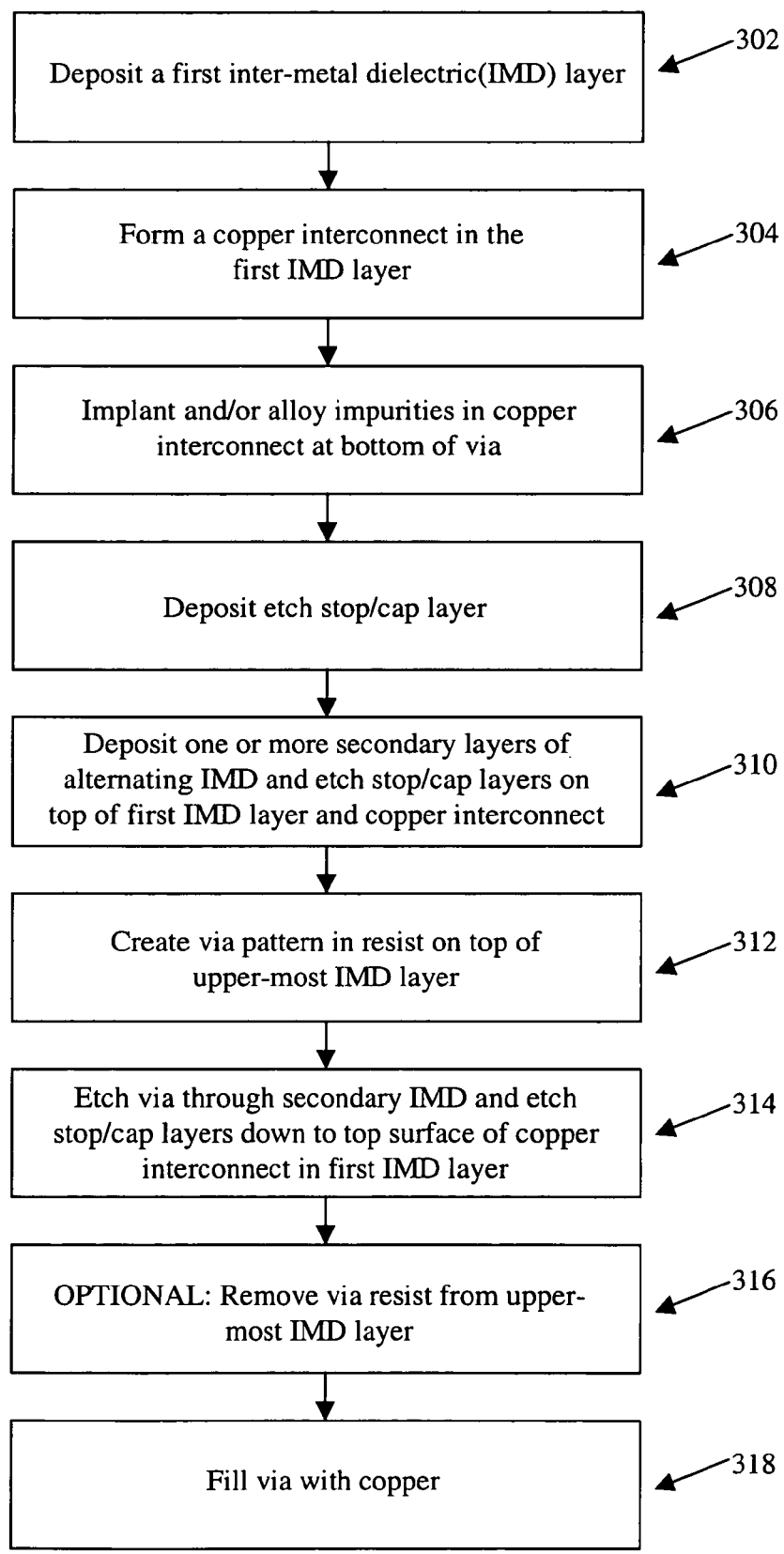
FIG. 3 is a flowchart of an alternate process for creating metal vias according to an embodiment of the present invention.

An alternate embodiment of the above process is shown at FIG. 3. The steps of FIG. 3 are similar to those in FIG. 2, but for their order. Specifically, the step 306 of implanting and/or alloying an impurity element in the copper interconnect is carried out soon after the copper interconnect is created at step 304. Thereafter, the steps of depositing a cap/etch stop layer 308 and secondary IMD layers 310, creating a via pattern 312, etching the via down to the copper interconnect 314 and filling the via with copper 318 are carried out in much the same way as described above with reference to FIG. 2. Thus, impurity elements are implanted and/or alloyed in the copper interconnect immediately after the interconnect has been formed, filled with copper and sanded back by CMP. The benefits of this process to the operation of the resulting microcircuit structure are the same as detailed above. Ease of manufacture and other process flow considerations may dictate the use of this alternative process. Additionally, this process may avoid defects in the secondary IMD layers above the copper interconnect that may be caused by annealing or implanting, since these steps are performed before the secondary IMD layers are deposited.

Further, it should be noted that the copper interconnect may be formed in one or more steps with the implanting and/or alloying steps carried out between the copper formation steps. Thus, for example, a first layer of copper may be filled into the bottom of the interconnect trough after it is etched without filling that trough. Then, implant and/or alloy steps may be completed, followed by another copper fill step to complete filling the interconnect trough. Similarly, it may also be that the impurity element is deposited first, followed by the copper fill for the interconnect, and then the impurity element and copper could be annealed to form the alloy.

In another embodiment, both implanting and alloying may be applied to a single via bottom. This might be done to use the combined positive effects of more than one impurity element, for example. Such an embodiment would include the steps delineated above with reference to FIGS. 2 and 3. Here, ions may be implanted first, followed by the alloying of a second impurity element, or vice versa. Further, here again implanting and/or alloying the impurity element (s) may take place before secondary IMD layers are deposited and etched (as in FIG. 3), or after those steps are completed (as in FIG. 2).

It should be noted that the methods of the present invention can be implemented into a standard process flow without any additional masking steps. In other words, no additional photolithography or etch steps are added by the above embodiments.

Returning to FIG. 4, the implant and/or alloy step is depicted by the arrows 418. At this point in the process, the via 416 is still empty—i.e. the via has not been filled with copper. The local area at the bottom of the via is considered the zone of interest 420. This is the area in which killer voids may form due to micro-void aggregation under field stresses, grain boundary effects and the other mechanisms described previously. The zone of interest 420 encompasses the top surface of the copper interconnect 408 under the via and proximate to the via bottom, as well as a portion of the depth of the copper interconnect in this area. The zone of interest 420 may also encompass part of the bottom portion of the via.

By implanting and/or alloying impurity elements in the zone of interest 420, micro-voids will be prevented from migrating to the top surface of the copper interconnect 408 and along the metal interconnect-cap layer interface 403 to aggregate in the zone of interest 420 under the via 416. This beneficial feature of the addition of impurity elements may be the product of one or more mechanisms such as: reducing the stress fields in the copper interconnect; creating a high stress field sink for vacancies away from the bottom of a via; reducing vacancy formation by limiting re-crystallization or grain growth in the interconnect; and/or impeding the diffusion of vacancies in the bulk interconnect or at the metal-capping layer interface. If the impurity elements are introduced below the top surface of the copper interconnect, such impurities may act as a sink to draw the micro-voids away from the bottom of the via, thereby avoiding a killer void.

Figure 5:
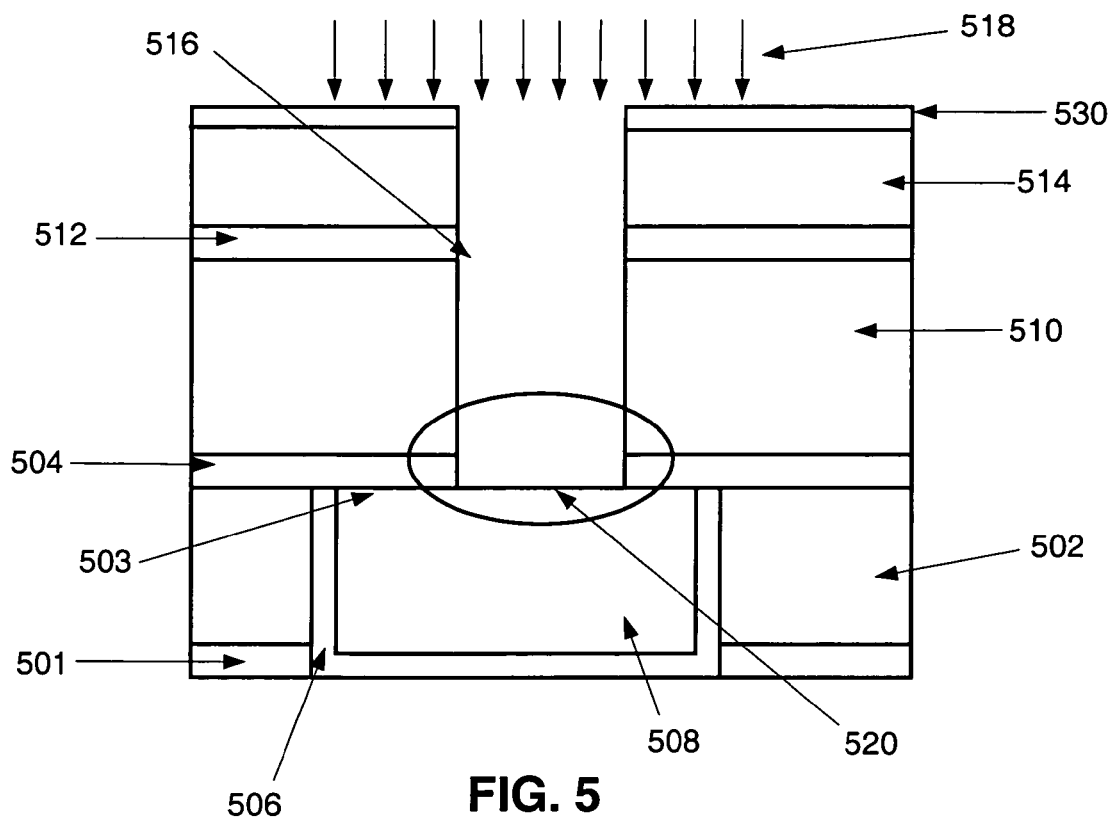
FIG. 5 is a cross-sectional view of an empty via through two inter-metal dielectric layers, with a cap layer on top of the top surface of the top layer of inter-metal dielectric, showing impurity elements being implanted into and/or deposited on a metal interconnect.

FIG. 5 shows a similar structure to that of FIG. 4 and like elements bear the same reference numbers increased by 100—i.e. an empty via 516 formed through two IMD layers 510, 514, an etch stop layer 512, and a cap layer 504. The via 516 has a bottom at or below the top surface of the copper interconnect 508 under the via. However, FIG. 5 differs in that it shows a photoresist layer 530 left on the top surface of the uppermost IMD layer 514. This is the photoresist used to pattern the via opening on the top surface of the upper most IMD layer 514 so that the via 516 can be etched. In other words, at the optional step 214 in FIGS. 2 and 316 in FIG. 3, the photoresist 530 is not cleaned off after the via has been etched. Implanting and/or alloying one or more impurity elements is then conducted, as shown by the arrows 518 and described above. By maintaining the photoresist 530 throughout the implanting and/or alloying steps, the photoresist may be used to protect the top surface of the uppermost IMD layer 514 from receiving unnecessary and unwanted impurity elements.

Figure 6:
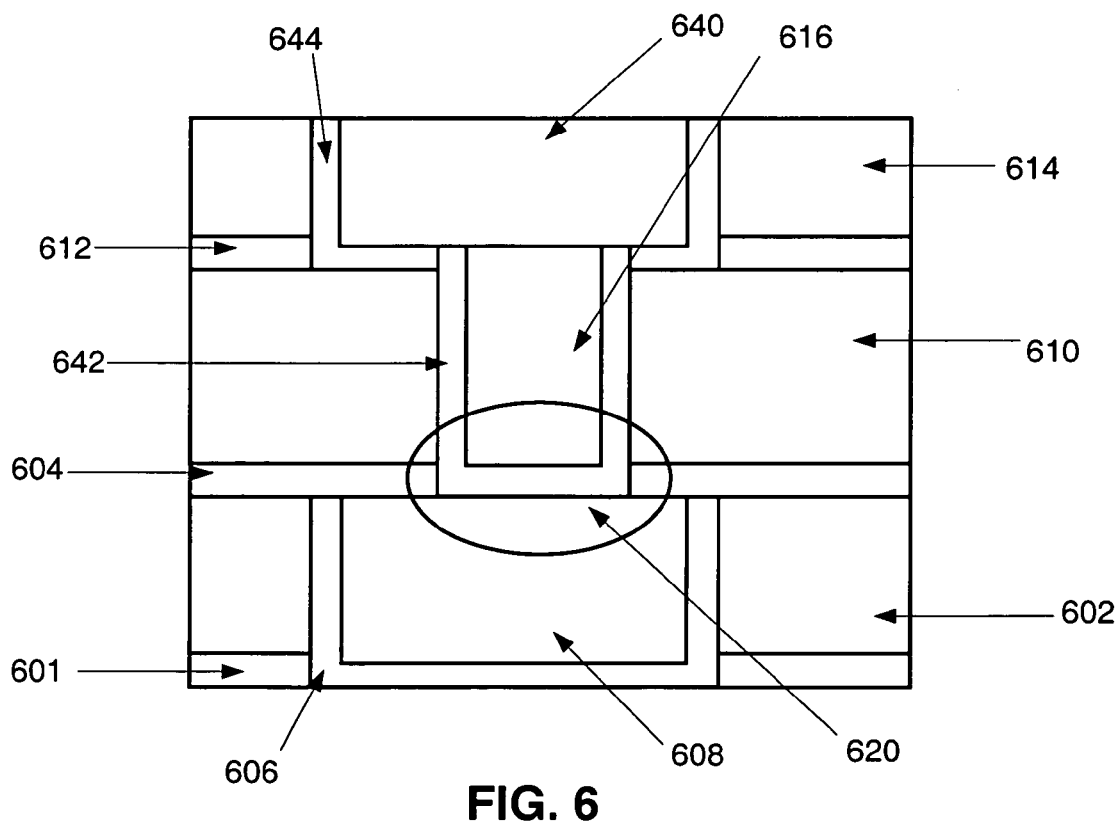
FIG. 6 is a cross-sectional view of a metal-filled via through an inter-metal dielectric layer, the via forming a connection between upper and lower metal interconnects.

FIG. 6 shows an example of a microelectronic circuit structure according to an embodiment of the present invention. Again, like elements to the structures shown in FIGS. 4 and 5 bear the same reference numbers increased by 100 over the reference numbers in FIG. 5. A first layer of inter-metal dielectric (IMD) 602 includes a filled copper interconnect 608. The copper interconnect 608 has a barrier layer 606 surrounding it to separate the copper interconnect from the IMD layer 602. The barrier layer 606 may be made of such elements as Ti/TiN or Ta/TaN. A cap layer 604 is configured to lie on top of the first IMD layer 602. Second and third MD layers 610, 614 separated by an etch stop layer 612 are formed on top of cap layer 604. A via 616 filled with a metal connects the first metal interconnect 608 with a second, upper copper interconnect 640. A barrier layer 642, 644 lines both the upper metal interconnect 640 and the via 616. The metal filler for the first metal interconnect, via and upper metal interconnect will most likely be the same material. Area 620 encompasses the local region proximate to the bottom of the via 616 and a portion of the top surface of the first copper interconnect 608, wherein impurity elements have been implanted and/or alloyed. These impurity elements contribute to a stable and reliable connection between the first copper interconnect 608 and the upper copper interconnect 640. It should be understood that more IMD, cap and etch stop layers may be included, and more complicated structures may be manufactured according to the claimed invention.

The preferred metal for current and future microstructure circuits is copper. Copper has various characteristics that are advantageous for use in interconnects and vias, such a low resistivity. Additionally, copper works very well with the methods and structures of the present invention, as doped versions of copper have a significantly lower incidence of micro-void formation and micro-void aggregation. The thickness of copper used in interconnects and vias should generally be between 1,000 and 50,000 Angstroms. Preferably the copper thickness will be between 2,000 and 4,000 Angstroms.

Impurity elements are chosen from those that can be implanted and/or alloyed with copper, and which operably limit the formation of solid opens, or "killer voids." An impurity element may be chosen for any one or more of the following exemplary positive effects that its inclusion in the copper interconnect may provide: reducing the stress fields in the metal interconnect; creating a high stress field sink for vacancies away from the bottom of the via; reducing vacancy formation by limiting re-crystallization or grain growth in the interconnect; and/or impeding the diffusion of vacancies in the bulk interconnect or at the copper interconnect-cap layer interface.

An additional consideration may be the effect of the impurity element on the physical or electrical character of the copper interconnect. For example, the chosen elements should have little or no negative impact on the physical or electrical character of the copper in the area of the impurity. Thus, resistivity and inter-metal capacitance should not increase significantly with the addition of the impurity element. However, the negative effects of an increase in resistivity, for example, may be outweighed in a given structure or manufacturing process by the positive effects of limiting the formation of solid opens. The increase in residual resistivity for various alloys of copper (at a given atomic percentage of the alloyed element to the copper as a whole) as compared to pure copper is an example of one parameter that may be used to choose beneficial dopants. For example, looking at doping elements that will produce only a limited increase in the resistivity of the alloyed copper interconnect and via, one finds that silver, calcium, zinc, cadmium, gold, beryllium, manganese, palladium and aluminum make useful alloy elements. This is because these elements increase the residual resistivity by less than a factor of one. Further, an element such as magnesium may be especially attractive as an impurity element for its low solubility in copper and the fact that it diffuses in copper at relatively low temperatures. The use of each such impurity element with copper should be reviewed for how efficiently and easily the alloy may be produced in a standard alloying and annealing process in a common process flow. We refer again to *Copper Metallization for ULSI and Beyond*, Murarka et al., in Critical Reviews in Solid State and Materials Sciences, 20(2):87–124 (1995), incorporated by reference in its entirety here for what it teaches of the mechanical, chemical and electrical properties of copper.

Elements that may be beneficially implanted as impurity or dopant ions in an area of the copper interconnect at the bottom of a via in the above embodiments include: oxygen, argon, hydrogen, helium, xenon, neon and krypton. Elements that may be beneficially alloyed with the copper interconnect in an area at the bottom of a via include: magnesium, silver, calcium, zinc, cadmium, gold, beryllium, palladium, aluminum, mercury, indium, nickel, boron, gallium, platinum, manganese, silicon, tin, lead, germanium, chromium, cobalt and titanium.

EXAMPLES

In one example of the above embodiments of the present invention, hydrogen is the impurity element implanted into the top surface of a copper interconnect in the area at the bottom of a via. Hydrogen is implanted, because it has a positive effect on grain boundary migration of micro-voids—i.e. it retards or prevents the migration of micro-voids along copper grain boundaries. Additionally, implantation of hydrogen has a limited negative effect on the electrical properties and physical integrity of the copper.

The hydrogen implant energy should be between 1 and 1,000 KeV, and most preferably between 10 and 100 KeV. Of course, the implant energy will be chosen to achieve a desired depth of the implanted ions in the copper interconnect. This implantation includes setting a pre-determined implant energy. For example, the implant energy may be set to limit the depth of penetration of the implanted ions only to an area near the top surface of the copper interconnect under the via. Alternatively, the implant energy may be set to achieve a desired depth of ion penetration into the copper interconnect. This last may be done to create a field-stress sink area below the surface of the copper interconnect in order that the sink will draw micro-voids away from the bottom of the via. The dose of hydrogen ions implanted in the copper should be in the range of $1 \times 10^{12}$ to $1 \times 10^{17}$ cm$^{-2}$, and most preferably between $1 \times 10^{13}$ and $1 \times 10^{14}$ cm$^{-1}$. Of course, the dose may be altered for specific applications wherein more or less dopant has positive effects on the prevention of killer voids and/or the electrical or physical properties of the doped copper.

In another example of the above embodiments of the present invention, argon is the impurity element implanted into the top surface of a copper interconnect in the area at the bottom of a via. Argon is implanted to create additional point defects that may retard the movement of micro-void vacancies. Additionally, implantation of argon has a limited negative effect on the operability of the copper interconnect or the manufacturing process.

The argon implant energy should be between 3 and 3,000 KeV, most preferably between 30 and 300 KeV. Of course, the implant energy will be chosen to achieve a desired depth of the implanted ions in the copper interconnect. The dose of hydrogen ions implanted in the copper should be in the range of $1 \times 10^{12}$ to $1 \times 10^{17}$ cm$^{-2}$, and most preferably between $1 \times 10^{13}$ and $1 \times 10^{14}$ cm$^{-2}$. Of course, the dose may be altered for specific applications wherein more or less dopant has a positive effect on the prevention of killer voids and/or the electrical or physical properties of the doped copper.

In yet a further example of the above embodiments, magnesium is the impurity element alloyed with the copper interconnect in an area at the top of the interconnect and below the via bottom. Magnesium deposition followed by an anneal step will allow the magnesium to precipitate at the copper grain boundaries. The magnesium at the copper grain boundaries impedes dislocation motion, and thereby increases the yield strength (or creep resistance). Additionally, magnesium alloying of less than 2 atomic % has only a small effect on copper resistivity.

Magnesium may be deposited by chemical vapor deposition (CVD) techniques or by plasma vapor deposition (PVD) techniques. However, if low-k IMDs are being used, it is better to use PVD (sputtering) techniques to avoid damaging the low-k material. Magnesium should be deposited to a thickness of between 10 and 1,000 Angstroms, and most preferably between 50 and 100 Angstroms. The alloy temperature for the magnesium should be between 200 and 1,000 degrees C., and most preferably between 400 and 600 degrees C.

It should be clear to those skilled in the art that the present invention may apply to other metals used in vias and interconnects, such as silver, for example. Further, other impurity and dopant elements may be incorporated into the metal interconnect and metal via. Although less of a problem, micro-voids at the top of vias may be addressed by similar impurity implant processes.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A microelectronic circuit structure, comprising:
   a metal interconnect layer in a first inter-metal dielectric layer of a circuit structure;
   an etch stop layer on top of the first inter-metal dielectric layer;
   a second inter-metal dielectric layer on top of the etch stop layer;
   a metal via passing through the second inter-metal dielectric layer and the etch stop layer, the via having a bottom area contacting the metal interconnect layer; and
   a portion of the metal interconnect layer under the via bottom doped with first and second impurity elements to limit the growth of micro-voids between the metal interconnect layer and the via;
   wherein the first impurity element is hydrogen that is implanted into the portion of the metal interconnect layer under the via bottom;
   the second impurity element is alloyed with the portion of the metal interconnect layer under the via bottom by depositing the second impurity element on said portion and annealing the deposited impurity element; and
   the metal in the metal interconnect layer and the via includes copper, the hydrogen is implanted at an implant energy in a range between 1 and 1,000 KeV, and the hydrogen ion implant dose is in a range between $1 \times 10^{12}$ cm$^{-2}$ and $1 \times 10^{17}$ cm$^{-2}$.

2. The microelectronic circuit structure of claim 1, wherein the first and second impurity elements limit the formation of solid opens in the metal interconnect layer under the via.

3. The microelectronic circuit structure of claim 1, wherein the metal interconnect layer comprises copper.

4. The microelectronic circuit structure of claim 1, wherein the via is filled with copper.

5. The microelectronic circuit structure of claim 1, wherein the first impurity element in the doped portion of the metal interconnect layer under the via bottom is at a predetermined depth within the metal interconnect layer.

6. The microelectronic circuit structure of claim 1, wherein said portion of the metal interconnect layer under the via bottom is doped with the first and second impurity elements prior to formation of the second inter-metal dielectric layer.

7. The microelectronic circuit structure of claim 1, wherein said portion of the metal interconnect layer under the via bottom is doped with the first and second impurity elements subsequent to formation of the second inter-metal dielectric layer.

8. The microelectronic circuit structure of claim 1 wherein the second impurity element is silver, zinc, cadmium, gold, beryllium, mercury, indium, nickel, boron, gallium, platinum, manganese, silicon, lead, germanium, chromium, cobalt or titanium.

* * * * *